United States Patent
Sakamoto

(10) Patent No.: US 9,960,097 B2
(45) Date of Patent: May 1, 2018

(54) SEMICONDUCTOR DEVICE

(71) Applicant: FUJI ELECTRIC CO., LTD., Kawasaki-shi (JP)

(72) Inventor: Yo Sakamoto, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days. days.

(21) Appl. No.: 15/069,329

(22) Filed: Mar. 14, 2016

(65) Prior Publication Data

US 2016/0197024 A1    Jul. 7, 2016

Related U.S. Application Data

(63) Continuation of application No. PCT/JP2015/055237, filed on Feb. 24, 2015.

(30) Foreign Application Priority Data

Mar. 11, 2014    (JP) .................................. 2014-047344

(51) Int. Cl.
    *H01L 23/34*    (2006.01)
    *H01L 23/367*    (2006.01)
    (Continued)

(52) U.S. Cl.
    CPC ...... *H01L 23/3672* (2013.01); *H01L 21/4867* (2013.01); *H01L 21/4882* (2013.01);
    (Continued)

(58) Field of Classification Search
    CPC ............. H01L 23/3672; H01L 21/4867; H01L 21/4871; H01L 23/40; H01L 2023/4068
    See application file for complete search history.

(56) References Cited

U.S. PATENT DOCUMENTS 8,491,998 B2    7/2013  Komatsu et al.
2005/0258550 A1 *  11/2005  Morita ................ H01L 21/4871
                                                257/784
(Continued)

FOREIGN PATENT DOCUMENTS

CN    102438776 A    5/2012
JP    2006-245437    *  9/2006  ............... H05K 1/02
(Continued)

OTHER PUBLICATIONS

PCT, "International Search Report for International Application No. PCT/JP2015/055237" (May 19, 2015).
(Continued)

*Primary Examiner* — Khiem D Nguyen
(74) *Attorney, Agent, or Firm* — Manabu Kanesaka

(57) ABSTRACT

A semiconductor device manufacturing method includes a step of preparing a semiconductor unit, having a first main surface including a heat releasing portion and a second main surface opposite to the first main surface, in which is mounted a semiconductor chip, a step of preparing a cooler having a flat surface, a step of applying a paste including metal nanoparticles to the first main surface of the semiconductor unit or the flat surface of the cooler, a step of bringing the first main surface of the semiconductor unit and the flat surface of the cooler into contact through the paste, and a step of applying a pressurizing force uniform in-plane to the second main surface of the semiconductor unit at the same time as raising the temperature of the paste, thereby sintering the paste and forming a junction layer.

7 Claims, 11 Drawing Sheets

(51) Int. Cl.
*H01L 23/373* (2006.01)
*H01L 21/48* (2006.01)

(52) U.S. Cl.
CPC ........ *H01L 23/3735* (2013.01); *H01L 23/367* (2013.01); *H01L 23/3737* (2013.01); *H01L 2224/48091* (2013.01); *H01L 2224/73265* (2013.01); *H01L 2924/181* (2013.01); *H01L 2924/19107* (2013.01)

(56) References Cited

U.S. PATENT DOCUMENTS

| | | |
|---|---|---|
| 2011/0042447 A1 | 2/2011 | Komatsu |
| 2013/0112993 A1 | 5/2013 | Hayashi et al. |

FOREIGN PATENT DOCUMENTS

| | | | | |
|---|---|---|---|---|
| JP | 2006-245437 A | 9/2006 | | |
| JP | 2006-352080 A | 12/2006 | | |
| JP | 2007-083288 A | 4/2007 | | |
| JP | 2007-109833 A | 4/2007 | | |
| JP | 2010-232366 A | 10/2010 | | |
| JP | 2011-077280 A | 4/2011 | | |
| JP | 2012-142465 | * | 7/2012 | ............. H01L 23/34 |
| JP | 2012-142465 A | 7/2012 | | |
| WO | 2009/116136 A1 | 9/2009 | | |

OTHER PUBLICATIONS

China Patent Office, "Office Action for Chinese Patent Application No. 201580001844.0," dated Nov. 10, 2017.

* cited by examiner

SEMICONDUCTOR DEVICE

CROSS-REFERENCE TO RELATED APPLICATION

This is a continuation application of PCT/JP2015/055237 filed on Feb. 24, 2015, which claims a priority of Japanese Patent Application No. 2014-047344 filed on Mar. 11, 2014, the disclosure of which is hereby incorporated.

TECHNICAL FIELD

The present invention relates to a semiconductor device.

BACKGROUND ART

FIG. 10 is a main portion sectional view of an existing semiconductor module 500. FIG. 10 shows a state wherein the semiconductor module 500 is fixed to a metal cooler 62.

The existing semiconductor module 500 includes a metal base 51, an insulating substrate 54, a back surface metal plate 52 of which is fixed by solder 53 to the metal base 51, and a semiconductor chip 57 fixed by solder 56 to a front surface circuit plate 55 of the insulating substrate 54. Also, the existing semiconductor module 500 includes a resin case 58 fixed to the metal base 51, an external terminal 59 integrally molded with the case 58, the semiconductor chip 57, a circuit plate 55, and a wire 60 connected to the external terminal 59. Furthermore, the existing semiconductor module 500 includes a sealing material 61, such as gel, that fills the case 58. Further, the cooler 62 is fixed across a compound 63 with good thermal conductivity between the metal plate 52 and cooler 62.

FIG. 11 is a main portion sectional view of another existing semiconductor module 600.

Unlike the semiconductor module 500, the semiconductor module 600 includes the semiconductor chip 57 fixed by the solder 56 to the front surface circuit plate 55 of the insulating substrate 54, and an external terminal 65 (metal bar). Also, the semiconductor module 600 includes a leading end portion 65a of the bent external terminal 65, and a mold resin 66 that seals leaving a back surface 52a and one portion of a side surface 52b of the metal plate 52 exposed. The leading end portion 65a of the external terminal 65 is disposed above a nut globe 68, wherein a metal nut 67 is embedded in a depressed portion formed from the surface of the molded resin 66. The external terminal 65 and an unshown external wiring bar are fixed with a bolt, utilizing an unshown through hole formed in the leading end portion 65a of the external terminal 65, and the nut globe.

A single phase circuit, two phase circuit, or three phase circuit of an inverter circuit can be formed by the semiconductor module 500 or 600.

A gap is formed due to the effect of warping or the like between a back surface 51a of the metal base 51 and a flat surface 62a of the cooler 62 in the semiconductor modules 500 and 600. Therefore, a compound 63 with good fluidity is applied, or the compound 63 is applied thickly, in order that the compound 63 spreads throughout the interior of the gap. Further, by the compound 63 spreading easily, the adhesion between the metal base 51 and cooler 62 is increased.

Also, in PTL 1, a description is given of an electronics device wherein a semiconductor device and a cooler are fixed by metal nanoparticles.

CITATION LIST

Patent Literature

PTL 1: JP-A-2010-232366

SUMMARY OF INVENTION

Technical Problem

However, a compound 63 with high fluidity is pushed to the outer side of the gap by repeated thermal transformation of the metal base 51. Therefore, the adhesion between the back surface 51a of the metal base 51 and the flat surface 62a of the cooler 62 is liable to decrease. Also, the thermal conductivity of the compound 63 is in the region of approximately 1 W/m·K, which is extremely low compared with the thermal conductivity of 390 W/m·K of copper or the thermal conductivity of 240 W/m·K of aluminum. Therefore, the more thickly the compound 63 is applied, the lower the cooling performance becomes. Also, the solder 53 joining the insulating substrate 54 and metal base 51 has a thermal conductivity in the region of 50 W/m·K, which is a low value compared with that of copper or aluminum. Applying a material with a high thermal conductivity instead of the compound 63 or solder 53 is necessary in order to improve the cooling performance of the semiconductor module.

Also, in PTL 1, it is described that the semiconductor device and cooler are fixed by being pressurized across metal nanoparticles between the semiconductor device and cooler. However, there is no description of evening the pressurizing force in order to obtain good bondability, or of the form of a joint surface.

Solution to Problem

In one aspect of the invention, a semiconductor device manufacturing method is a manufacturing method including a step of preparing a semiconductor unit, having a first main surface including a heat releasing portion and a second main surface opposite to the first main surface, in which is mounted a semiconductor chip, a step of preparing a cooler having a flat surface, a step of applying a paste including metal nanoparticles to the first main surface of the semiconductor unit or the flat surface of the cooler, a step of bringing the first main surface of the semiconductor unit and the flat surface of the cooler into contact across the paste, and a step of applying a pressurizing force uniform in-plane to the second main surface of the semiconductor unit at the same time of raising the temperature of the paste, thereby sintering the paste and forming a junction layer.

Also, in another aspect of the invention, a semiconductor device includes a semiconductor unit, having a first main surface including a heat releasing portion and a second main surface opposite to the first main surface, in which is mounted a semiconductor chip, a cooler having a flat surface, wherein the flat surface is positioned to face the first main surface of the semiconductor unit, and a junction layer formed of a sintered body of metal nanoparticles that joins the first main surface of the semiconductor unit and the flat surface of the cooler, wherein a peripheral portion is thicker than a central portion.

BRIEF DESCRIPTION OF DRAWINGS

FIGS. 1(a) and 1(b) are diagrams of a semiconductor device 100 of a first example according to the invention, wherein FIG. 1(a) is a main portion sectional view, and FIG. 1(b) is a sectional view enlarged in the vertical direction of FIG. 1(a) where a junction portion between a metal plate 3c and cooler 2 is enlarged.

FIGS. 2(a)-2(d) are manufacturing process diagrams of the semiconductor device 100 of a second example according to the invention, wherein FIG. 2(a) is a sectional view of a semiconductor unit 1, FIG. 2(b) is a sectional view of the cooler 2, FIG. 2(c) is a sectional view of the metal plate 3c, which is one portion of a heat releasing portion of the semiconductor unit 1 enlarged in the vertical direction, and FIG. 2(d) is a sectional view of the cooler 2 enlarged in the vertical direction.

FIGS. 3(a)-3(d), continuing from FIG. 2(d), are manufacturing process diagrams of the semiconductor device 100 of the second example according to the invention, wherein FIG. 3(a) is a sectional view of the semiconductor unit 1, FIG. 3(b) is a sectional view of the cooler 2, FIG. 3(c) is a sectional view of the metal plate 3c, which is one portion of the heat releasing portion of the semiconductor unit 1 enlarged in the vertical direction, and FIG. 3(d) is a sectional view of the cooler 2 enlarged in the vertical direction.

FIGS. 4(a) and 4(b), continuing from FIG. 3(d), are manufacturing process diagrams of the semiconductor device 100 of the second example according to the invention, wherein FIG. 4(a) is a sectional view of the semiconductor unit 1 and cooler 2, while FIG. 4(b) is a sectional view of the metal plate 3c and cooler 2.

FIGS. 5(a) and 5(b), continuing from FIG. 4(b), are manufacturing process diagrams of the semiconductor device 100 of the second example according to the invention, wherein FIG. 5(a) is a sectional view of a heating furnace 9, a pressurizing mechanism 20, the semiconductor unit 1, and the cooler 2, while FIG. 5(b) is a sectional view of the metal plate 3c and cooler 2.

FIGS. 6(a) and 6(b), continuing from FIG. 5(b), are manufacturing process diagrams of the semiconductor device 100 of the second example according to the invention, wherein FIG. 6(a) is a sectional view of the semiconductor unit 1 and cooler 2, while FIG. 6(b) is a sectional view of the metal plate 3c and cooler 2.

FIG. 7 is an illustration illustrating a method of applying a uniform pressurizing force P to a second main surface 1b of the semiconductor unit 1 using a pressurizing mechanism 20a.

DESCRIPTION OF EMBODIMENTS (General Disclosure)

Figure 1A:
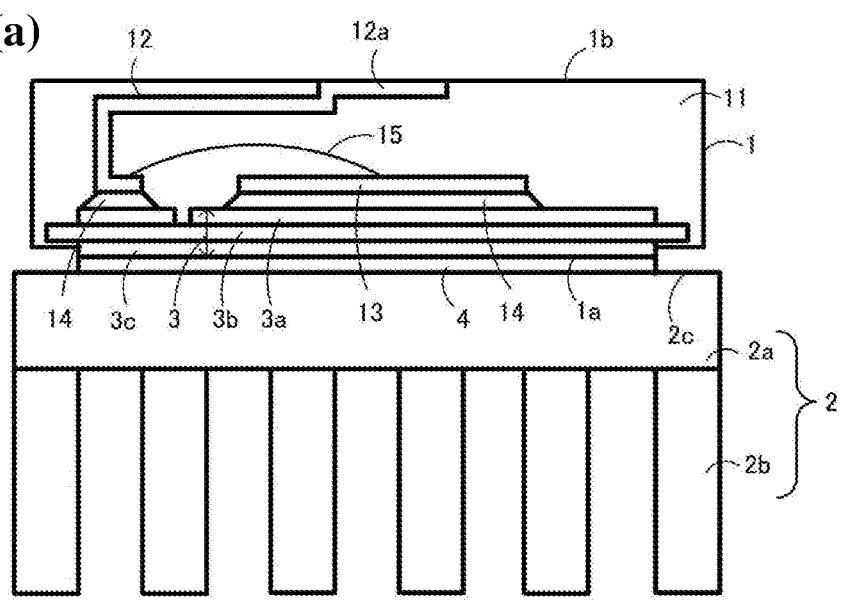

It is good when a semiconductor device manufacturing method includes a step of preparing a semiconductor unit that has a first main surface including a heat releasing portion and a second main surface opposing the first main surface, and in which is mounted a semiconductor chip. It is good when the semiconductor device manufacturing method includes a step of preparing a cooler that has a flat surface. It is good when the semiconductor device manufacturing method includes a step of applying a paste that includes metal nanoparticles to the first main surface of the semiconductor unit or the flat surface of the cooler. It is good when the semiconductor device manufacturing method includes a step of bringing the first main surface of the semiconductor unit and the flat surface of the cooler into contact across the paste. It is good when the semiconductor device manufacturing method includes a step of applying a pressurizing force that is uniform in-plane to the second main surface of the semiconductor unit at the same time as the temperature of the paste is raised, thereby sintering the paste and forming a junction layer.

It is good when the variation of the pressurizing force in the plane of the second main surface is within ±10%. It is good when the heat releasing portion is caused to warp in a protruding form in the step of preparing the semiconductor unit. It is good when a gap between a peripheral portion of the heat releasing portion and the cooler is 10 μm or more and 300 μm or less. The gap between the peripheral portion of the heat releasing portion and the cooler may be 20 μm or more and 100 μm or less. A central portion of the heat releasing portion may contact the cooler.

It is good when the pressurizing force is 5 MPa or more and 20 MPa or less. It is good when the temperature rises to 150° C. or more and 350° C. or less.

It is good when a semiconductor device includes a semiconductor unit that has a first main surface including a heat releasing portion and a second main surface opposing the first main surface, and in which is mounted a semiconductor chip. It is good when the semiconductor device includes a cooler that has a flat surface, wherein the flat surface is positioned opposite to the first main surface of the semiconductor unit, and a junction layer formed of a metal nanoparticle sintered body that joins the first main surface of the semiconductor unit and the flat surface of the cooler, wherein a peripheral portion is thicker than a central portion.

It is good when the thickness of the peripheral portion of the junction layer is 10 μm or more and 300 μm or less. The thickness of the peripheral portion of the junction layer may be 20 μm or more and 100 μm or less. A central portion of a heat releasing portion may be contact the cooler.

It is good when the heat releasing portion is an insulating substrate formed by a circuit plate, an insulating plate, and a metal plate being stacked. It is good when the cooler is joined to the metal plate. It is good when the semiconductor chip is fixed to the circuit plate. It is good when the metal nanoparticles are configured of silver or cooper.

An embodiment will be described using the following examples.

The same reference signs are assigned to the common structures throughout the embodiment, and redundant descriptions are omitted.

The examples are not limited to the embodiment described, and can be changed to various aspects without departing from the scope of the technical idea of the invention.

EXAMPLE 1

Figure 1B:
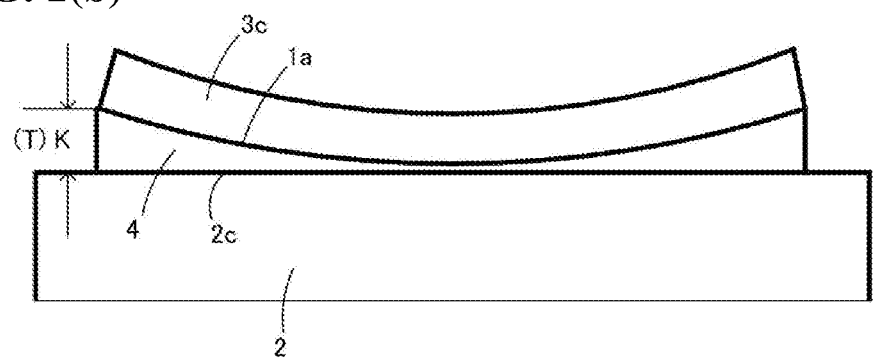

FIGS. 1(a) and 1(b) are diagrams of a semiconductor device 100 of a first example according to the invention. FIG. 1(a) is a main portion sectional view, while FIG. 1(b) is a sectional view enlarged in the vertical direction of FIG. 1(a), wherein a junction portion between a metal plate 3c and cooler 2 is enlarged.

The semiconductor device 100 is formed of the cooler 2, which is made of metal, and a semiconductor unit 1 fixed to the cooler 2 across a junction layer 4. The junction layer 4 is a layer, wherein a paste 5, which is a joining material using metal nanoparticles, for example, silver nanoparticles, is sintered.

The semiconductor unit 1 includes an insulating substrate 3, which is a heat releasing portion, on a first main surface (the lower surface in the drawing). The insulating substrate 3 is formed of, for example, an insulating plate 3b of a ceramic or the like, a metal plate 3c formed on the back surface of the insulating plate 3b, and a circuit plate 3a formed on the front surface of the insulating plate 3b.

The semiconductor unit 1 includes a semiconductor chip 13, such as an IGBT (insulated gate bipolar transistor), and external terminal 12 fixed by solder 14 to the circuit plate 3a. Also, the semiconductor unit 1 includes a wire 15 that electrically connects the semiconductor chip 13 and circuit plate 3a. Furthermore, the semiconductor unit 1 includes a leading end portion 12a of the bent external terminal 12, and a mold resin 11 that seals leaving the back surface and one portion of the side surface of the metal plate 3c exposed. Herein, an unshown nut globe is disposed below the leading end portion 12a.

A first main surface 1a of the semiconductor unit 1 is formed by the exposed surface of the metal plate 3c. Also, a second main surface 1b of the semiconductor unit 1 is formed by the mold resin 11 and the leading end portion 12a of the external terminal 12.

Furthermore, the semiconductor device 100 includes the metal cooler 2 fixed across the junction layer 4 to the first main surface 1a, including the heat releasing portion, of the semiconductor unit 1. The cooler 2 is formed of a cooling plate 2a having a flat surface 2c, and a fin 2b disposed on the surface opposing the flat surface 2c.

In this example, as shown in FIG. 1(b), the insulating substrate 3 (the metal plate 3c in the drawing) is disposed to curve in a downwardly protruding form on the flat surface 2c of the cooler 2. Further, the junction layer 4 disposed between the flat surface 2c and insulating substrate 3 is formed such that a peripheral portion is thicker than a central portion. The central portion and peripheral portion refer to positions in a plane parallel to the flat surface 2c. Also, it is good when the central portion of the junction layer 4 refers to a region facing the center of the insulating substrate 3. In this example, a region facing the leading end of the protruding portion of the insulating substrate 3 is taken to be the central portion of the junction layer 4. Also, it is good when a region facing a peripheral portion of the first main surface 1a (for example, an edge of the insulating substrate 3) is taken to be the peripheral portion of the junction layer 4. That is, it is good when the region of the junction layer 4 facing the edge of the insulating substrate 3 is thicker than the region of the junction layer 4 facing the protruding portion of the insulating substrate 3. It is good when the thickness of the junction layer 4 facing the edge of the insulating substrate 3 refers to the average value of the thickness around the whole of the edge of the insulating substrate 3, or may refer to the minimum value. At this time, a thickness K of the junction layer 4 in the peripheral portion of the first main surface 1a is 10 µm to 300 µm. Also, the thickness K is preferably 20 µm to 100 µm. The value of the thickness K can be controlled by the size of the insulating substrate 3, the volume of the circuit plate 3a or metal plate 3c, the volume of the mold resin 11, the volume of the solder 14, and the like. The thickness K is set to practically the same value as a gap T between the metal plate 3c and cooler 2. It is good when the thickness of the junction layer 4 is smallest in the central portion and greatest in the peripheral portion. It is preferable that the thickness of the junction layer 4 increases gradually from the central portion toward the peripheral portion.

Although described in detail hereafter, an organic substance, such as an organic film covering metal nanoparticles or a particle dispersing solvent, is included in the paste 5, and the organic substance changes to gas when sintering is carried out. Herein, by adopting a length of 10 µm to 300 µm for the gap T of the peripheral portion, gas generated inside the paste can be efficiently emitted to the exterior from the gap T. Therefore, a highly reliable junction layer 4 that does not include excess gas can be obtained.

The semiconductor device 100 is, for example, a semiconductor module in which a 2-in-1 single-phase circuit is formed. A semiconductor device in which a 2-phase or 3-phase circuit is formed can be formed by plural semiconductor modules, in which a 2-in-1 single-phase circuit is formed, being aligned and joined across a junction layer to a common cooler. That is, a semiconductor device formed as a 4-in-1, 6-in-1, or 12-in-1 is formed.

EXAMPLE 2

FIGS. 2 (a) to 6 (b) are main portion process diagrams showing, in the order of steps, a method of manufacturing the semiconductor device 100 of a second example according to the invention.

Figure 2A:
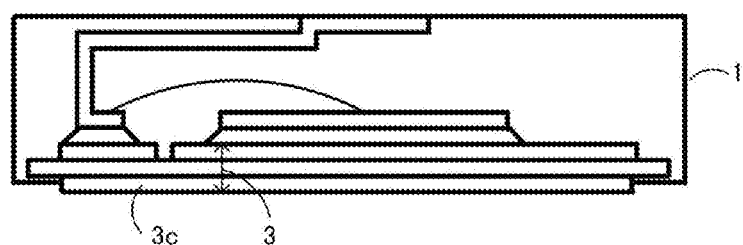
Figure 2B:
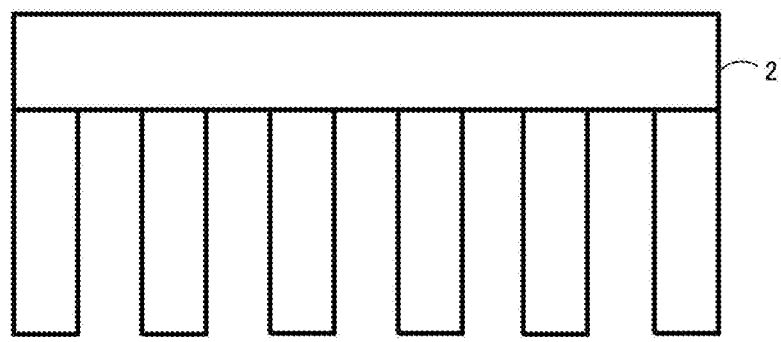
Figure 2C:
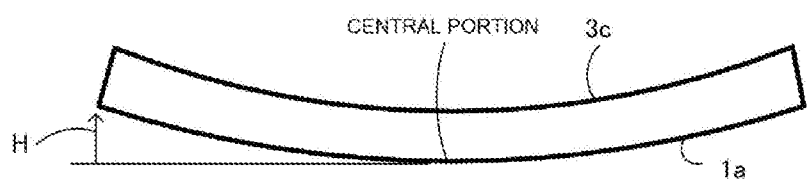
Figure 2D:

FIG. 2(a) is a sectional view of the semiconductor unit 1, FIG. 2 (b) is a sectional view of the cooler 2, FIG. 2(c) is a sectional view of the metal plate 3c, which is one portion of the heat releasing portion of the semiconductor unit 1 enlarged in the vertical direction, and FIG. 2(d) is a sectional view of the cooler 2 enlarged in the vertical direction.

Firstly, the semiconductor unit 1 and cooler 2 are prepared. At this time, in the semiconductor unit 1, the insulating substrate 3, which is the heat releasing portion, is caused to curve so that the central portion thereof protrudes downward. That is, the first main surface 1a of the semiconductor unit 1 is also caused to curve so that the central portion thereof protrudes downward. With the central portion of the first main surface 1a as a reference, a height H of the peripheral portion is 10 µm to 300 µm (or preferably, 20 µm to 100 µm).

FIGS. 3(a) to 3(d) are diagrams showing the step following the step shown in FIG. 2(d).

Figure 9:
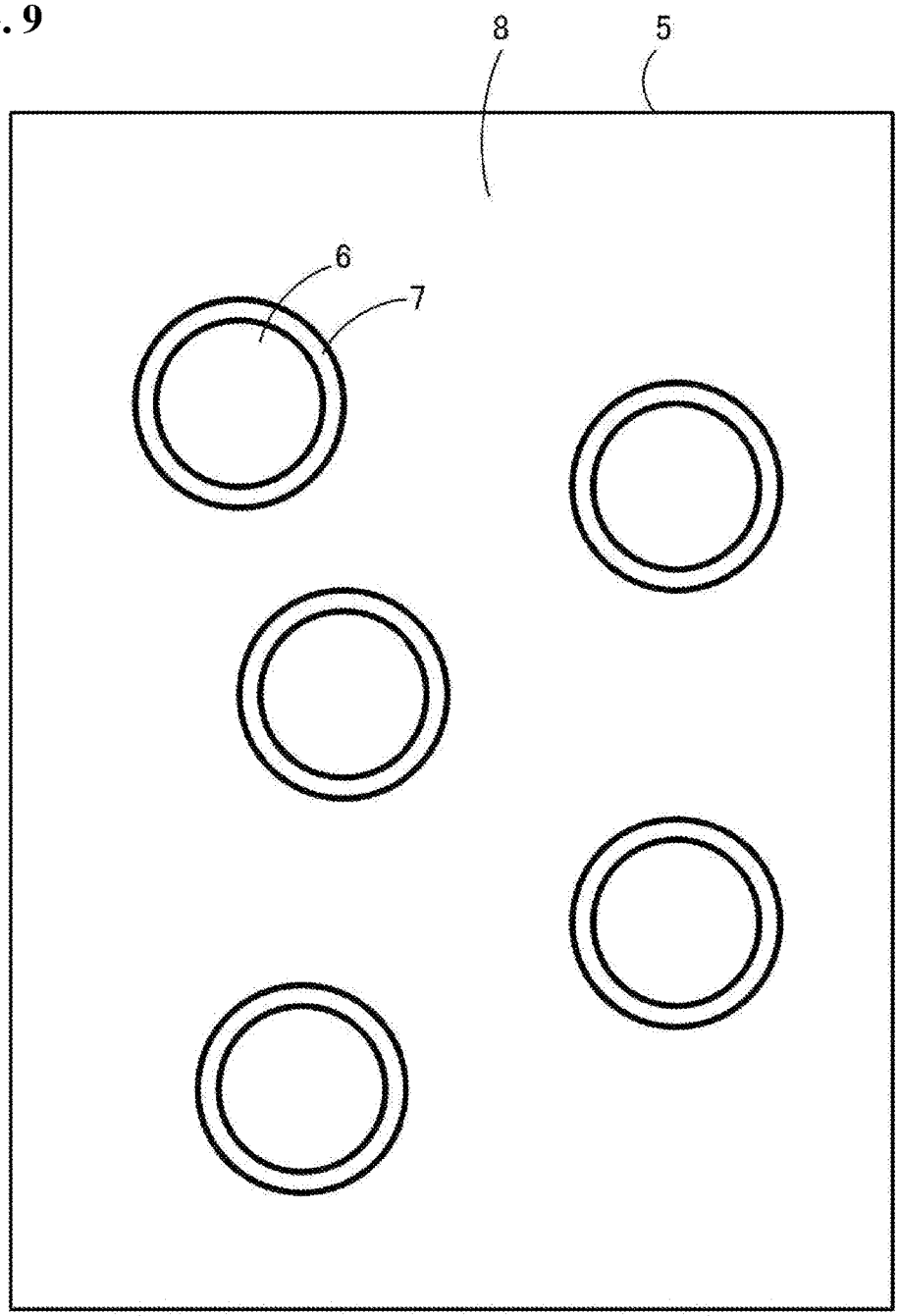
FIG. 9 is an illustration illustrating the configuration of a paste 5 configured of metal nanoparticles.
Figure 10:
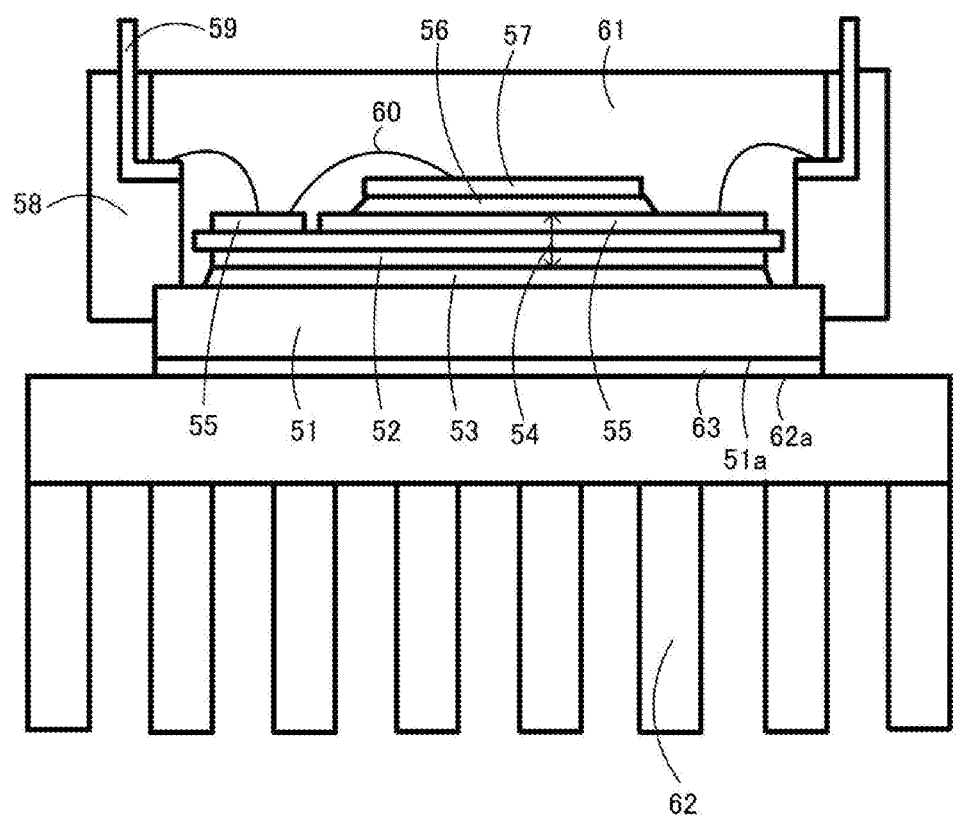
FIG. 10 is a main portion sectional view of an existing semiconductor module 500.
Figure 11:
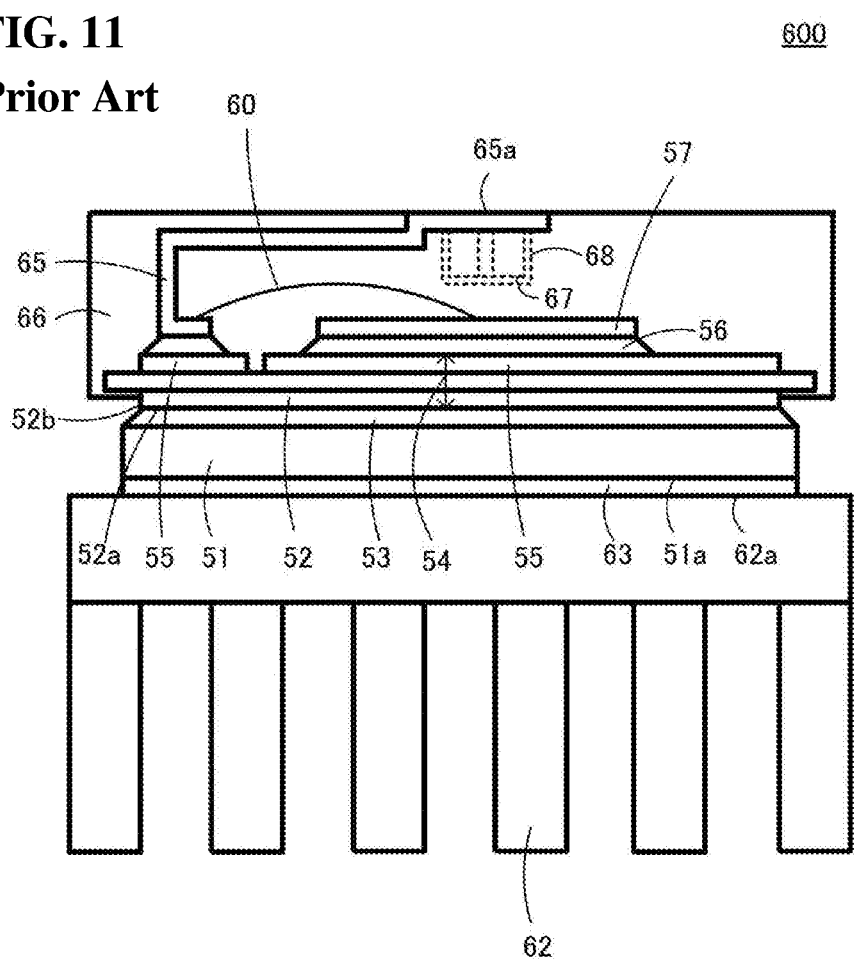
FIG. 11 is a main portion sectional view of another existing semiconductor module 600.

The paste 5, which is a joining material in which metal nanoparticles are used, is applied to a thickness of in the region of 100 µm to 200 µm on the first main surface 1a of the semiconductor unit 1. As shown in FIG. 9, the paste 5 is formed of, for example, metal nanoparticles 6 formed of silver or the like, organic films 7 covering the metal nanoparticles 6, and a solvent 8 that causes the metal nanoparticles 6 to disperse. The solvent includes one or a multiple of ethylene glycol, toluene, tetradecane, butanediol, and low grade alcohol.

Figure 3A:
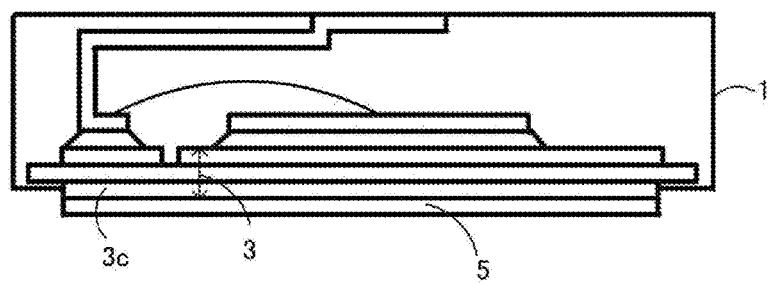
Figure 3B:
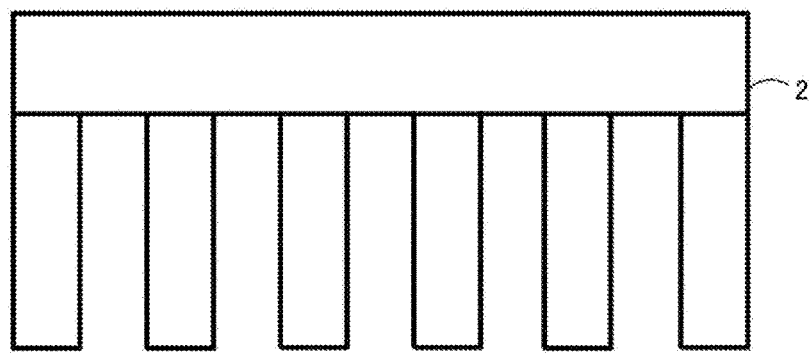
Figure 3C:
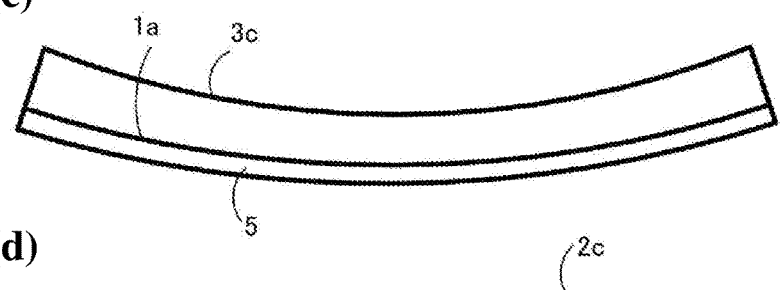
Figure 3D:
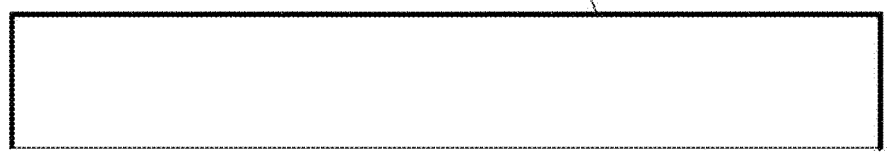
Figure 4A:
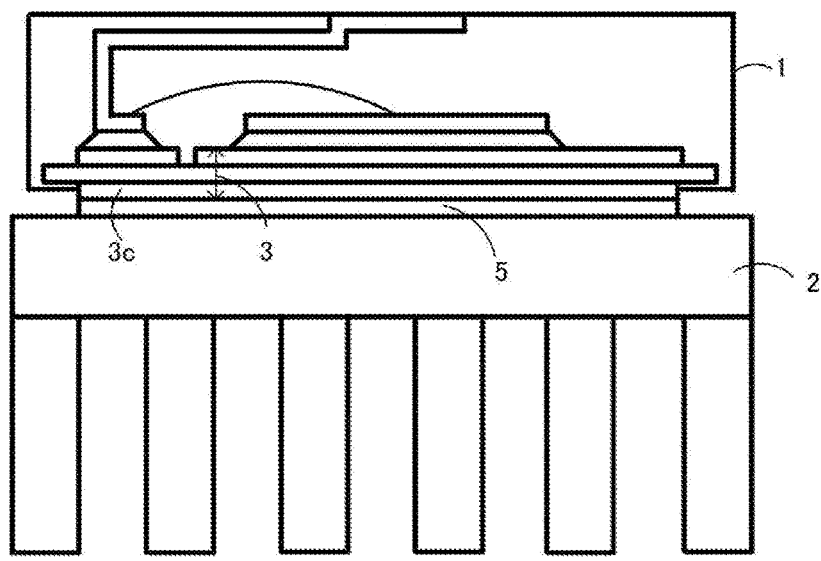
Figure 4B:
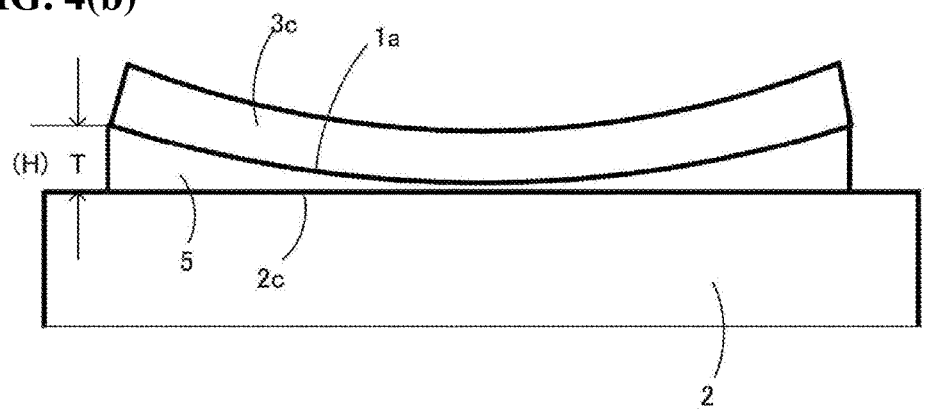

FIGS. 4(a) and 4(b) are diagrams showing the step following the step shown in FIG. 3(d).

The semiconductor unit 1 is mounted on the cooler 2 with the first main surface 1a of the semiconductor unit 1 contacting the flat surface 2c of the cooler 2 across the paste 5. The gap T between the peripheral portion of the first main surface 1a of the semiconductor unit 1 and the flat surface 2c of the cooler 2 is the same as H when the central portion of the first main surface 1a and the flat surface 2c almost contact. The gap T is preferably 10 µm to 300 µm, or more preferably 20 µm to 100 µm.

Although the paste 5 is applied to the first main surface 1a in this example, the semiconductor unit 1 and cooler 2 may contact after applying the paste 5 to the flat surface 2c.

Figure 5A:
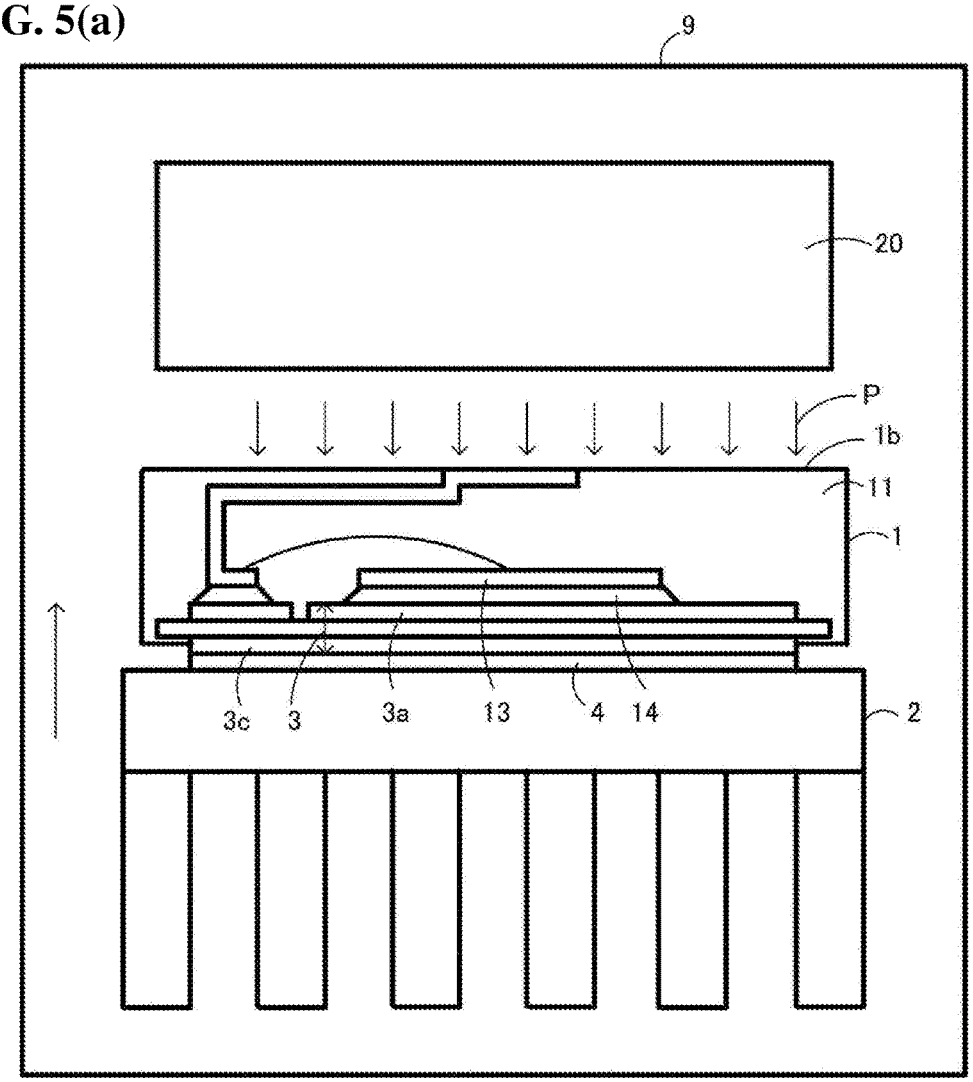
Figure 5B:
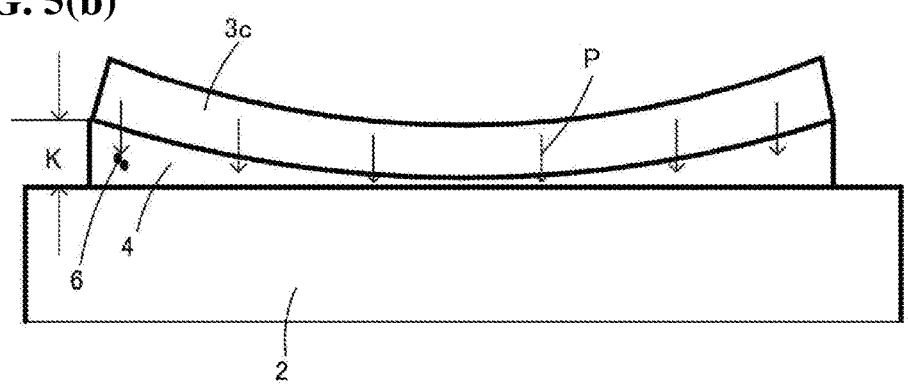

FIGS. 5(a) and 5(b) are diagrams showing the step following the step shown in FIG. 4(b).

The cooler 2 and semiconductor unit 1 mounted on the cooler 2 are inserted into a heating furnace 9, and the paste 5 is sintered by raising the temperature inside the heating furnace 9. At the same time, a uniform pressurizing force P is applied to the second main surface 1b of the semiconductor unit 1 using a pressurizing mechanism 20. At this time, gas generated by the organic film 7 and solvent 8 in the paste 5 is removed from an outer peripheral portion, and the metal nanoparticles 6 come to contact with each other. Further, the metal nanoparticles 6 are joined by the predetermined pressurizing force P being applied, whereby a good junction layer 4 is obtained.

When the pressurizing force P is uneven (for example, single side pressing) in the plane of the second main surface 1b in this step, unevenness occurs in the adhesion between the metal nanoparticles 6, and it becomes difficult to obtain good bondability over the whole of the joint surface. Therefore, it is important that pressurizing is carried out evenly in the plane of the second main surface 1b. It is good when variation in the pressurizing force is restricted to within ±10%.

When the thickness K of the junction layer 4 in the peripheral portion of the first main surface 1a is less than 10 μm, the average thickness decreases too far, whereby the bonding strength decreases, and heat cycle resistance decreases. Also, when the thickness K exceeds 300 μm, the thermal resistance of the junction layer 4 increases, and the heat releasing properties deteriorate. Therefore, it is good when the thickness K of the junction layer 4 is 10 μm to 300 μm. Also, the thickness K is more preferably 20 μm to 100 μm. Also, the thermal conductivity (170 W/m·K or higher) of the junction layer 4 is high compared with that of a compound or solder, because of which, even when the thickness K of the junction layer 4 is large in the peripheral portion, the effect on the thermal resistance is small provided that the thickness K is 300 μm or less.

When the internal temperature of the heating furnace 9 is lower than 150° C., sintering is insufficient, and the bonding strength decreases. Also, the internal temperature exceeding 350° C. is not desirable, as metal members (for example, aluminum or copper) such as the cooler 2 oxidize. Therefore, the internal temperature of the heating furnace 9 is preferably 150° C. to 350° C. When the temperature of the heating furnace 9 is 250° C. or higher, it is good when a high temperature solder is used as the solder 14 joining the circuit plate 3a and semiconductor chip 13.

When the pressurizing force P is less than 5 MPa, the pressurizing force P applied to the metal nanoparticles 6 is insufficient, because of which sintering is insufficient, and the bonding strength decreases. Also, when the pressurizing force P exceeds 20 MPa, cracking may occur in the insulating substrate 3. Therefore, the pressurizing force P is preferably 5 MPa to 20 MPa.

When the heating and pressurizing time is less than 20 minutes, sintering is insufficient, and sufficient bonding strength is not obtained. Meanwhile, the time exceeding 60 minutes is inefficient, as there is little change in the sintering state. Therefore, it is good when the heating and pressurizing time is 20 to 60 minutes.

Figure 6A:
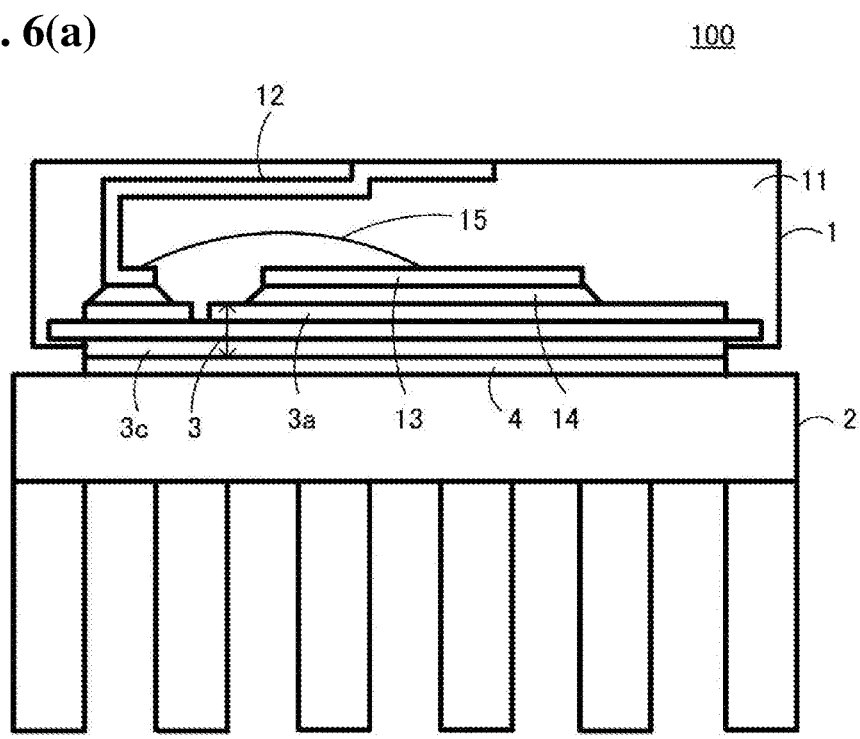
Figure 6B:
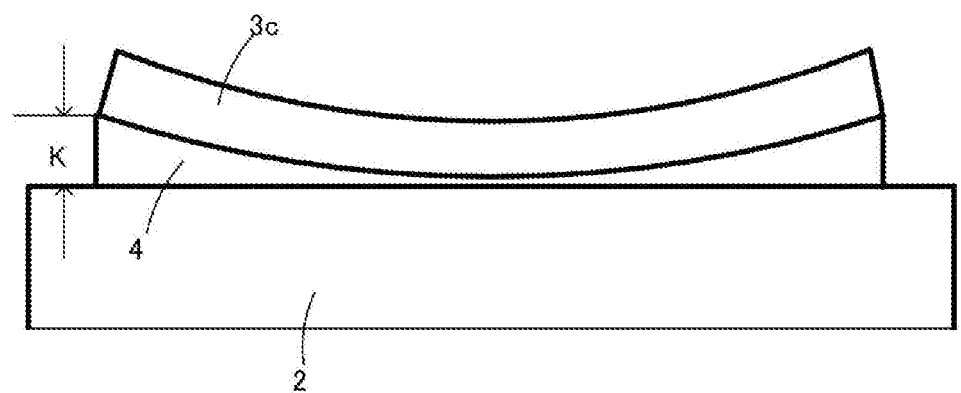

FIGS. 6(a) and 6(b) are diagrams showing the step following the step shown in FIG. 5(b). The semiconductor unit 1 and cooler 2 are removed from the heating furnace 9, whereby the semiconductor device 100 is completed.

Figure 7:
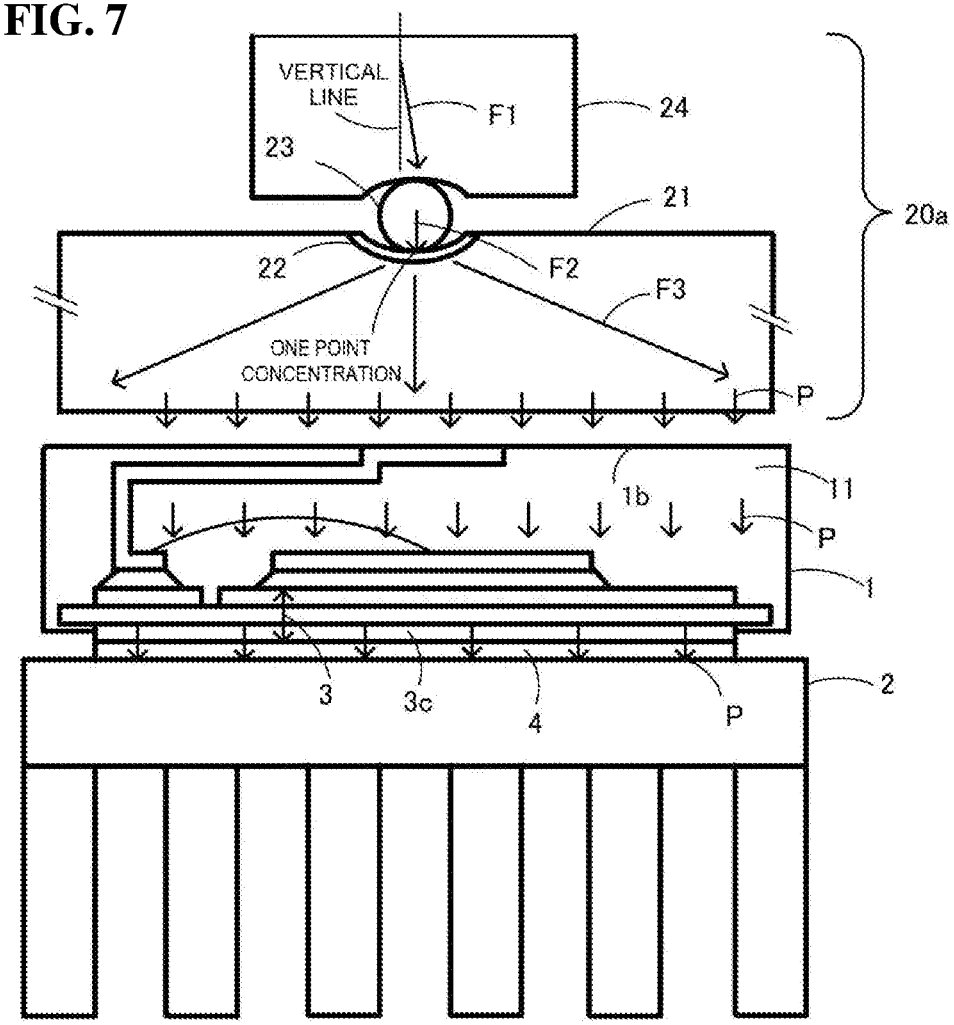

FIG. 7 is a diagram showing a pressurizing mechanism 20a as a specific example of the pressurizing mechanism 20 shown in FIGS. 5(a) and 5(b).

The pressurizing mechanism 20a is formed of a pressurizing block 21, a ball 23 formed of, for example, steel, and a pressurizing rod 24. When the second main surface 1b of the semiconductor unit 1 is flat, the back surface of the pressurizing block 21 contacting the second main surface 1b is also flat. The thickness of the pressurizing block 21 is large (for example, in the region of 1 cm) so that deformation due to pressurization does not occur. Iron, molybdenum, tungsten, or the like, in which plastic deformation is unlikely to occur, is used as the material of the pressurizing block 21. Also, a receptacle 22 that receives the ball 23 is provided in the center of the front surface of the pressurizing block 21. The ball 23 is disposed in the receptacle 22, and the ball 23 is pressurized with the columnar pressurizing rod 24. The pressurizing is carried out using a normal press device or the like.

In the pressurizing mechanism 20a, even when a force F1 transmitted from the pressurizing rod 24 to the ball 23 deviates from a vertical line, a force F2 transmitted from the ball 23 to the receptacle 22 of the pressurizing block 21 is concentrated in one point. The force F2 concentrated in one point becomes a force F3 dispersed within the pressurizing block 21, and becomes a uniform pressurizing force P at the back surface of the pressurizing block 21. The uniform pressurizing force P is transmitted to the second main surface 1b of the semiconductor unit 1, and furthermore, the uniform pressurizing force P is transmitted to the metal nanoparticles 6 through the insulating substrate 3, which is the heat releasing portion of the semiconductor unit 1. Therefore, the contact pressure between the metal nanoparticles 6 becomes uniform in the plane of the joint surface, a good junction layer 4 is formed, and good bondability is obtained over the whole of the joint surface. Herein, the pressurizing force P being uniform means that the in-plane variation of the pressurizing force P is ±10% or less.

Figure 8:
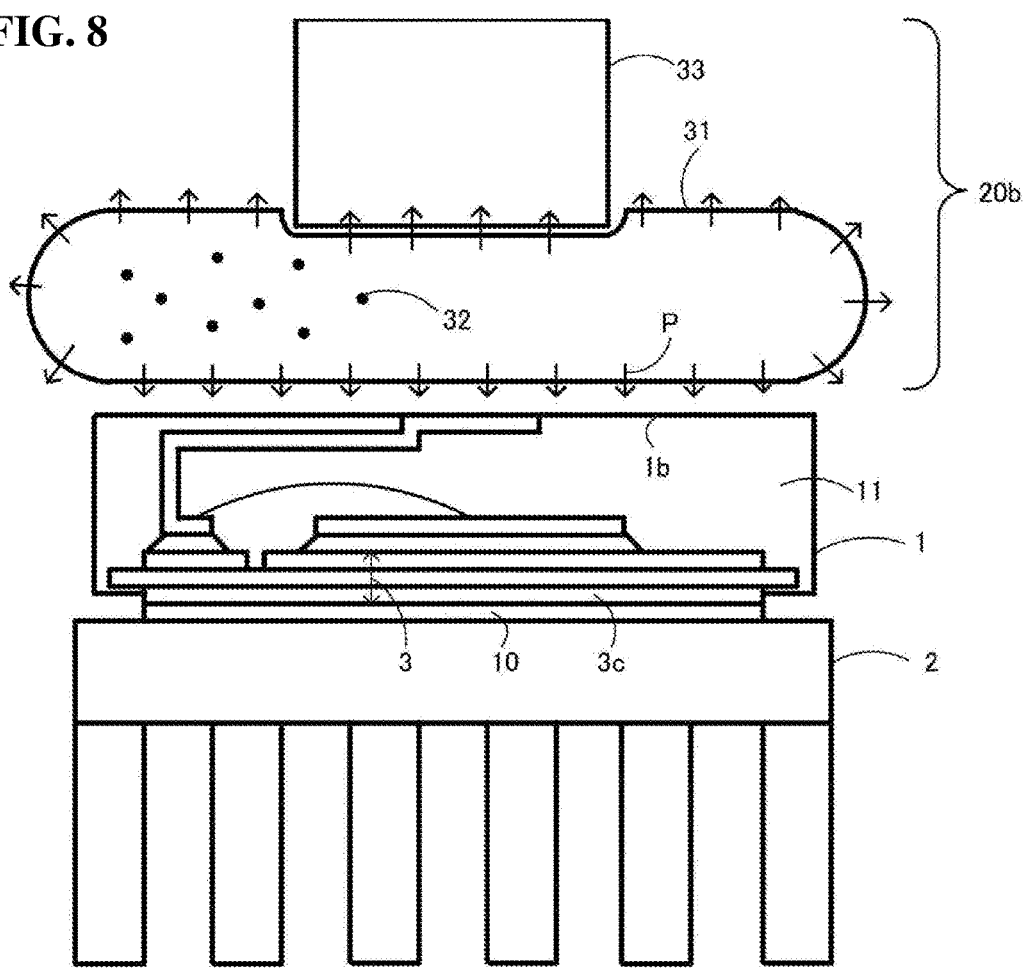
FIG. 8 is an illustration illustrating a method of applying the uniform pressurizing force P to the second main surface 1b of the semiconductor unit 1 using a pressurizing mechanism 20b.

FIG. 8 is a diagram showing a different pressurizing mechanism 20b. The pressurizing mechanism 20b is formed of a bag 31 (a heat-resistant rubber bag or the like) that has heat resistance and flexibility, carbon powder 32 filling the bag 31, and a pressurizing rod 33. By pressing the second main surface 1b of the semiconductor unit 1 across the bag 31, the second main surface 1b can be pressurized uniformly owing to the principle of hydrostatic pressure. As pressurizing is carried out utilizing hydrostatic pressure, a uniform pressurizing force P is transmitted to the semiconductor unit 1 even when there is irregularity in the pressurized second main surface 1b. Other than the heretofore described heat-resistant rubber bag, the bag 31 may be a bag formed of an epoxy resin sheet, or the like, having heat resistance and flexibility.

A case wherein the cooler 2 is air-cooled or self-cooled has been shown, but this example is of course applicable to a water-cooled cooler. Also, when wishing to make the cooler 2 more compact, or the like, the fin 2b may be omitted.

Also, a description has been given with silver nanoparticles as an example of the metal nanoparticles 6, but this is not limited, and copper nanoparticles or the like may be used.

According to the heretofore described examples, a semiconductor device with high cooling performance and having good bondability, and a manufacturing method thereof, can be provided by a semiconductor unit and cooler joined by a uniform pressurizing force across a metal nano-junction layer including metal nanoparticles.

Also, according to the heretofore described examples, existing structures such as a metal base 51 and compound 63 are not used, because of which the cost of members used can be reduced. Furthermore, as the metal base 51 is not used, the thickness is reduced by an amount equivalent to the thickness of the metal base 51, whereby the size of the semiconductor device 100 can be reduced.

REFERENCE SIGNS LIST

1 Semiconductor unit
2 Cooler
2*a* Cooling plate
2*b* Fin
3 Insulating substrate (heat releasing portion)
3*a* Circuit plate
3*b* Insulating plate
3*c* Metal plate
4 Junction layer
5 Paste
6 Metal nanoparticles
7 Organic film
8 Solvent
9 Heating furnace
11 Mold resin
12 External terminal
13 Semiconductor chip
14 Solder
15 Wire
20, 20*a*, 20*b* Pressurizing mechanism
21 Pressurizing block
22 Receptacle
23 Ball
24, 33 Pressurizing rod
31 Bag
32 Carbon powder
100 Semiconductor device

What is claimed is:

1. A semiconductor device, comprising:
a semiconductor chip;
a semiconductor unit having a first main surface including a heat releasing portion with a central portion and an outer portion outside the central portion, and a second main surface opposite to the first main surface, on which is mounted the semiconductor chip;
a cooler having a flat surface, and positioned to face the first main surface of the semiconductor unit; and
a junction layer formed of a sintered body of metal nanoparticles, and joining the first main surface of the semiconductor unit and the flat surface of the cooler, the junction layer having a peripheral portion thicker than a portion adjacent to the central portion of the first main surface and being arranged on an entirety of the first main surface outside the central portion facing the cooler,
wherein the central portion of the first main surface directly contacts the cooler, and the junction layer joins the outer portion of the first main surface and the cooler.

2. The semiconductor device according to claim 1, wherein the thickness of the peripheral portion of the junction layer is 10 μm or more and 300 μm or less.

3. The semiconductor device according to claim 1, wherein
the heat releasing portion is an insulating substrate including a circuit plate, an insulating plate, and a metal plate being stacked,
the cooler is joined to the metal plate, and
the semiconductor chip is fixed to the circuit plate.

4. The semiconductor device according to claim 1, wherein the metal nanoparticles are formed of silver or copper.

5. The semiconductor device according to claim 1, wherein the semiconductor unit includes a curved insulating substrate as the heat releasing portion, the curved insulating substrate having a curved shape such that a central portion of the insulating substrate protrudes downwardly than peripheral portions thereof.

6. The semiconductor device according to claim 5, wherein the curved insulating substrate has the curved shape curved in advance before bonding to the cooler.

7. The semiconductor device according to claim 6, wherein the sintered body of the metal nanoparticles includes an organic substance covering the metal nanoparticles, the organic substance changing gas and emitted when the metal nanoparticles are sintered.

* * * * *